United States Patent [19]
Sato et al.

[11] Patent Number: 5,404,332
[45] Date of Patent: Apr. 4, 1995

[54] APPARATUS FOR AND A METHOD OF DETECTING A MALFUNCTION OF A FIFO MEMORY

[75] Inventors: Hiroyuki Sato; Jinichi Yoshizawa; Hiroomi Tateishi; Junichi Tamura; Masayoshi Sekido, all of Kawasaki, Japan

[73] Assignee: Fujitsu Limited, Kanagawa, Japan

[21] Appl. No.: 245,435

[22] Filed: May 18, 1994

[30] Foreign Application Priority Data

Oct. 7, 1993 [JP] Japan .................................. 5-252004

[51] Int. Cl.⁶ ...................... G11C 7/00; G11C 29/00
[52] U.S. Cl. ................... 365/201; 365/189.04; 365/189.07; 371/21.1; 371/21.2
[58] Field of Search .............. 365/201, 189.07, 189.04, 365/221; 371/21.1, 21.2

[56] References Cited
U.S. PATENT DOCUMENTS 5,291,449 3/1994 Dehara ................................. 365/201
5,305,253 4/1994 Ward ........................... 365/189.07 X
5,309,387 5/1994 Mori ................................. 365/201 X
5,311,475 5/1994 Huang ....................... 365/189.07 X

FOREIGN PATENT DOCUMENTS 1511553 5/1978 United Kingdom .
2249644 5/1992 United Kingdom .

Primary Examiner—Do Hyun Yoo

[57] ABSTRACT

A write address counter for designating a write address of a memory counts up a control counter with an address change. A read address counter for designating a read address of the memory counts down the control counter with the address change. Inputted to an error detecting circuit are a write address counter value, a read address counter value and a control count value. There is detected whether a relationship such as Write Address Count Value−Read Address Count Value=−Control Count Value is established or not. If not established, this implies an error, and a reset circuit resets each counter.

10 Claims, 9 Drawing Sheets

APPARATUS FOR AND A METHOD OF DETECTING A MALFUNCTION OF A FIFO MEMORY

BACKGROUND OF THE INVENTION

1. Field of the Invention

The present invention is related generally to an apparatus for and a method of detecting a malfunction of a FIFO (first-in first-out) memory and, more particularly, to an apparatus for and a method of detecting a malfunction of a FIFO memory, which are capable of detecting a relative malfunction between a control counter and address designating elements employed for the FIFO memory.

2. Related Background Art

A FIFO memory has hitherto existed as a memory used for hardware which constitutes a communication network. This FIFO memory is employed in the case of taking a synchronism of the data when multiplexing the data in, e.g., data communications.

FIG. 11 illustrates a typical construction of the FIFO memory. Referring to FIG. 11, a FIFO memory circuit 101 comprises a memory 102, a write address counter 103 and a read address counter 104 both of which are connected to the memory 102. The FIFO memory circuit 101 also comprises a control counter 105 connected to both of the write address counter 103 and the read address counter 104.

This memory is composed of a multiplicity of micro memory areas to which addresses are respectively given. Then, when writing the data to the memory 102, the write address counter 103 designates the address of the micro memory area in the memory 102 while the data inputted via an input data line $\phi 1$ is written to the micro memory areas in the memory 102 of which address is designated. Similarly, when reading the data from the memory 102, the read address counter 104 designates the address, while the data stored in the micro memory area corresponding to this address to an output data line $\Phi 2$ is read out.

The two address counters 103 and 104 designate the addresses according to the same sequence, whereby first-in first-out can be attained. For instance, it is assumed that the memory 102 has n-pieces of micro memory areas, and addresses 0 through n−1 are given to the respective memory areas. The two address counters 103 and 104 go on changing locations of the address designation in a sequence of 0 through n−1 as circulated.

The write address counter 103 is driven by a clock CLK1 generated outwardly of the FIFO memory circuit 101. Similarly, the read address counter 104 is driven by a clock CLK2 generated outside the FIFO memory circuit 101. Further, the two address counters 103 and 104 perform count-up during the receiving of a count enabling signal from a control counter 105 but stop the count-up during the shutting off of the count enabling signals.

The control counter 105 is a counter added for managing operating statuses of the above two counters 103, 104 and for controlling these counters. That is, it is possible to indirectly grasp an occupied condition of the memory 102 by relatively checking present output values (addresses) of the two counters 103 and 104. For this reason, the control counter 105 constructed to perform the count-up each time the address designated by the write address counter 103 is changed and performs the count-down each time the address designated by the read address counter 104 is changed. As a result, it follows that a count value of the control counter 105 indicates the number of the micro memory areas holding unread data in the memory 102. Then, when the count value reaches its maximum value (corresponding to the number of the micro memory areas), the control counter 105 shuts off the write enabling signal to the write address counter 103 in order to inhibit a new data from being written to the memory 102. Reversely, when the count value comes to "0", the control counter 105 shuts off the enabling signal to the read address counter 104 in order to inhibit reading the data from the memory 102. Note that the control counter 105 is driven by a clock CLK0 generated outwardly of the FIFO memory 4 circuit 101.

Only a parity check has hitherto been conducted to check a malfunction of the thus constructed FIFO memory circuit 101. The parity check involves adding check bits termed parity bits beforehand to the data to be written in accordance with a fixed rule. Then, when reading the data from the memory, there is checked whether or not the data added with the parity bits still maintain this fixed rule. In consequence of this checking, if the above fixed rule is collapsed, it is recognized that the data are not correctly written or read. If the data are not correctly written or read, there is a high possibility in which the FIFO memory itself malfunctions. Hence, the occurrence of the malfunction of the FIFO memory can be presumed even by this parity check.

In the conventional parity check described above, however, what is directly detected is only an error of the data. Hence, the conventional parity check is not capable of surely detecting the malfunction of the FIFO memory circuit 101, especially the malfunctions of the address designating elements 103, 104 and the control counter 105 themselves.

That is, the clock CLK0 for driving the control counter 105 is formed outside the FIFO memory circuit 101. Then, the clock CLK0 is formed independently of other clocks CLK1 and CLK2; or, the clock CLK0 is common to the clock CLK1 but formed independently of the clock CLK2; or alternatively, the clock CLK0 is common to the clock CLK2 but formed independently of the clock CLK1.

Accordingly, the following condition is induced. The clock CLK1 is inputted to the write address counter 103, while the clock CLK0 is abruptly shut off, so that it is not inputted to the control counter 105. Under this condition, the address counter 103 changes the designation address and performs a new writing process, but, nevertheless, the control counter 105 can not take in the information. Further, there is caused a condition which follows. The clock CLK2 is inputted to the read address counter 104. However, the clock CLK0 is abruptly shut off, so that it is not inputted to the control counter 105. Under this condition, the address counter 104 changes the designation address and effects a new reading process, but, nevertheless, the control counter 105 can not take in the information. Hence, in these cases, it may happen that the actual number of the micro memory areas holding the unread data in the memory 102 is not coincident with the count value of the control counter 105.

Incidentally, the increment and decrement of the control counter 105 are cumulative. Therefore, once such a data take-in defect is caused, the count value thereof is not restored to its normal status at all, even if the control counter 105 resumes the operation after clock CLKO has been restored afterward to its normal status.

Then, if the FIFO memory circuit 101 continues the operation without recognizing that such a malfunction of the control counter 105 is produced, drawbacks may be caused, which is the lack or the double-reading of the data, and so on.

The occurrence of lack of data is a problem arising under such a condition that the write address counter 103 changes the designation address, but, nevertheless, the control counter 105 does not count up. That is, under this condition, a larger number of micro memory areas than the count value recognized by the control counter 105 hold the unread data in the memory 102. In this case, the reading process is inhibited when the count value of the control counter 105 comes to "0", and, therefore, the read address counter 104 becomes incapable of reading in spite of the fact that the unread data remain in the memory. Further, the control counter 105 does not stop enabling the writing process so far as the count value recognized by the counter 105 itself does not reach the maximum value. Accordingly, for example, there may exist a case where a further writing process is enabled even when all the micro memory areas in the memory 102, as a matter of fact, hold the unread data. In this case, the first-in (previously written) data is erased by overwriting and is thus lost. Moreover, the read address counter 104 is incapable of distinguishing whether or not the data to be actually read has undergone a first-in process merely by designating the address according to a simply determined sequence. Consequently, when the read of the data is carried out in this state, the read address counter 104 reads overwritten last-in data in advance as if it is the erased first-in data. Thereafter, it follows that the read address counter 104 reads data entering intermediately. Accordingly, the data sequence becomes random.

Further, the double-reading of the data is the problem arising under such a condition that the control counter 105 does not count down despite the fact that the read address counter 104 changes the designation address. Under this condition, the unread data in the memory 102 are held only by a smaller number of micro memory areas than the count value recognized by the control counter 105. Hence, the read address counter 104 actually designates the read addresses for all the unread data and then reads the data. Nevertheless, the control counter 105 does not inhibit the reading process on the assumption that the unread data still remain. Therefore, it follows that the read address counter 104 further designates the read addresses. The read address counter 104 can not, however, distinguish whether or not the data to be actually read has already been read. For this reason, it follows that the data which has been once read but not yet erased is read once again. Accordingly, in this case also, the data sequence becomes random.

There exits a problem in which the malfunction of the control counter 105 which induces a variety of troubles can not be detected by the conventionally practiced parity check.

Further, one of the address counters 1.03 and 104 malfunctions, and, if the sequence of address designation is mistakenly set, the same problems as the above-mentioned arise.

SUMMARY OF THE INVENTION

It is a primary object of the present invention to provide an apparatus for and a method of detecting a malfunction of a FIFO memory.

A FIFO memory has: a storing element for storing data; a writing element for writing the data to the storing element by relating the data to a predetermined address; a reading element for reading the data written by the writing element from the storing element in accordance with the predetermined address; a first address designating element for designating the address while changing the address in accordance with a fixed sequence with respect to the writing element when writing the data to the storing element; and a second address designating element for designating the address while changing the address in accordance with the same sequence as the fixed sequence with respect to the reading element when reading the data from the storing element and thereby causing the reading element to read the data in accordance with the sequence written by the writing element. In this FIFO memory, an apparatus for detecting a malfunction of the FIFO memory according to the present invention comprises; a counter for effecting count-up each time the address designated by the first address designating element is changed and effecting count-down each time the address designated by the second address designating element is changed; and a detecting element for detecting a mutual contradiction between the address designated by the first address designating element, the address designated by the second address designating element and a count value of the counter and thereby detecting an occurrence of a relative malfunction between the first designating element, the second designating element and the counter.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

First Embodiment

Figure 1:
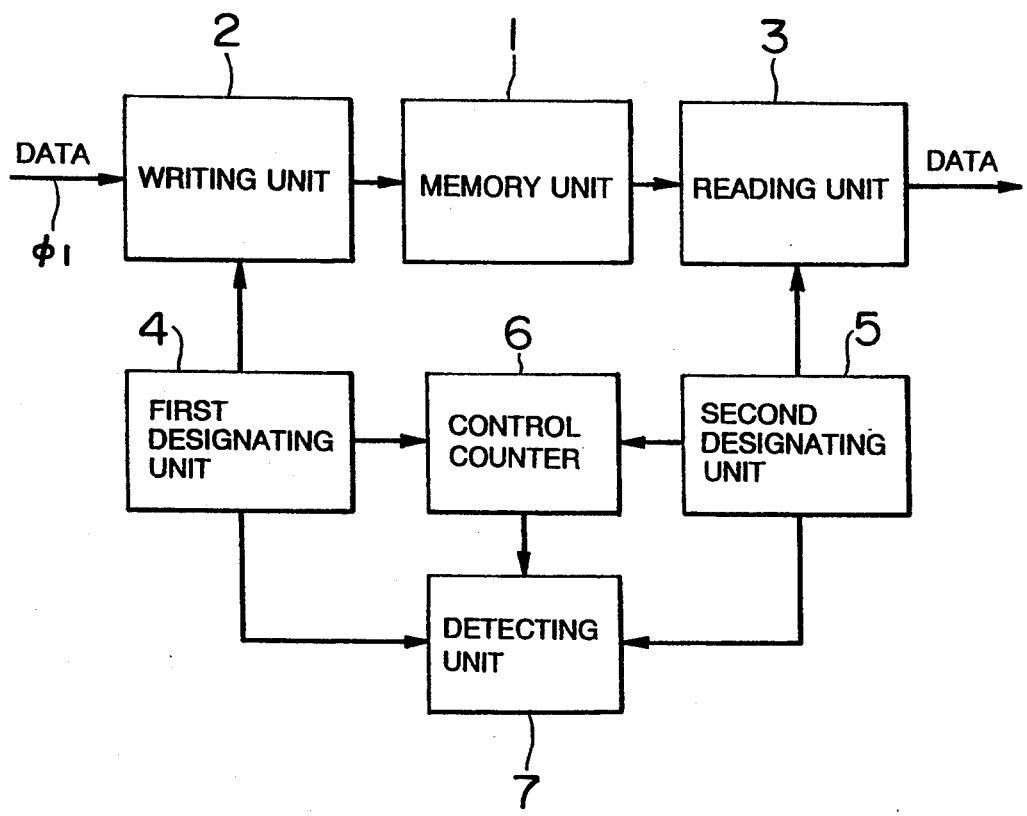
FIG. 1 is a block diagram relative to a first embodiment of this invention.

FIG. 1 illustrates a FIFO memory device in accordance with a first embodiment of the present invention.

This FIFO memory device comprises a memory unit 1, a writing unit 2, a reading unit 3, a first designating unit 4, a second designating unit 5, a control counter 6 and a detecting unit 7. The writing unit 2 is connected to a data input terminal of the memory unit 1. The reading unit 3 is connected to an output terminal of the memory unit 1. The first designating unit 4 is connected to the writing unit 2. The second designating unit 5 is connected to the reading unit 3. The control counter 6 is connected to the first and second designating units 4 and 5. The detecting unit 7 is connected to the first and second designating units 4 and 5 as well as to the control counter 6.

This memory unit 1 has memory areas for respectively recording data. Then, the data inputted is stored in any location of the memory area of this memory unit 1.

The writing unit 2 specifies any one of memory locations and writes the inputted data in this specified memory location. For this purpose, the writing unit 2 receives inputting of a write address from the first designating unit 4.

The reading unit 3 is a unit for reading the data written to the memory unit 1. The reading unit 3 specifies any one of memory locations in the memory unit 1 and reads the data from this specified location. For this purpose, the reading unit 3 receives inputting of a read address from the second designating unit 5.

The first designating unit 4 sequentially changes a write location relative to the writing unit 2 and, for this purpose, changes the address to be designated according to a fixed sequence.

The second designating unit 5 sequentially changes a read location relative to the reading unit 3. The second designating unit 5 performs reading in the same sequence as writing by the writing unit 2 and, for this purpose, changes the address to be designated in the same sequence with the first designating unit 4.

The control counter 6 receives inputting of signals from the first designating unit 4 each time the first designating unit 4 changes the write address. Then, the control counter 6 effects count-up each time the counter 6 receives the signal from the first designating unit 4. The counter 6 also receives inputting of a signal from the second designating unit 5 every time the second designating unit 5 changes the read address. Subsequently, the counter 6 conducts count-down every time the counter 6 receives the signal from the second designating unit 5.

The detecting unit 7 receives inputting of a write address value outputted by the first designating unit 4, a read address value outputted by the second designating unit 5 and a count value of the control counter 6. Then, the detecting unit 7 detects an existence or non-existence of contradiction between these values. Subsequently, the detecting unit 7, when detecting the contradiction, detects a relative malfunction between the first designating unit 4, the second designating unit 5 and the control counter 6. This "detection of the relative malfunction" implies all of detections of the malfunctions of some or whole of the first designating unit 4, the second designating unit 5 and the control counter 6.

The above memory unit 1 may be a semiconductor memory or a magnetic core memory. In short, the requirement thereof is that the memory unit 1 is capable of storing plural pieces of data each consisting of an array of electric signals. Note that the memory area of the memory unit 1 may be segmented into a multiplicity of micro memory areas, and an address may be set in each of these micro memory areas. Further, the memory unit 1 may be constructed of a plurality of and plural kinds of memories. In a word, the memory unit 1 may be so constructed as to be capable of storing a fixed location with a certain item of data by designating the address.

Moreover, an address designating sequence of the first designating unit 4 and the second designating unit 5 may be set to increment a value toward a maximum value from a minimum value or decrement it toward the minimum value from the maximum value.

Further, the first designating unit 4 may be, when the counter value of the control counter 6 reaches the maximum value, inhibited from operating by the control counter 6. On the other hand, the second designating unit 5 may be, when the counter value of the control counter 6 reaches the minimum value, inhibited from operating by the control counter 6.

Note that even when inhibiting the operation of the first designating unit 4 in this manner, it is impossible to stop a flow of data strings transmitted to the memory 1 via a data input line $\phi1$. Hence, the write is inhibited by forbidding the operation of the first designating unit 4. At the same time, all the circuits of the communications system including the FIFO memory may be reset. Note that a write inhibiting condition may be extended to those exclusive Of this.

The detection of the relative malfunction by the detecting unit 7 may involves the following manner. Made is a comparison between the designation address of the first designating unit 4, the designation address of the second designating unit 5 and the count value of the control counter 6. As a result of this comparison, if a relative difference between the designation address of the first designating unit 4 and the designation address of the second designating unit 5 is not coincident with the count value of the control counter 6, it may be recognized that the malfunction is produced. It may also be recognized that the malfunction is caused, if a value obtained by subtracting the count value of the control counter 6 from the designation address of the first designating unit 4 is not coincident with the designation address of the second designating unit 5. Alternatively, it may be recognized that the malfunction is produced, if a value obtained by adding the count value of the control counter 6 to the designation address of the second designating unit 5 is not coincident with the designation address of the first designating unit 4.

This detecting unit 7 may perform the detection continuously all the time or in an intermittent manner. In this case, the detection may be effected only when the count value of the control counter .6 becomes "0" or only when the designation address of the first designating unit 4 or the second designating unit 5 comes to have a specified value. Further, the detection may also be conducted regularly by providing a timer.

An unillustrated reset device is incorporated into the thus constructed apparatus for detecting the malfunction of the FIFO memory. When the above detecting unit 7 detects the malfunction, this reset device may be operated. Then, this reset device may reset the whole FIFO memory circuit or reset only the control counter 6, the first designating unit 4 and the second designating unit 5. The reset device may also reset the system including the FIFO memory circuit, e.g., the whole communications system.

The detection of the malfunction of the FIFO memory in this embodiment involves comparing the designation address of the first designating unit 4, the designation address of the second designating unit 5 and the count value of the control counter 6 with each other. As a result of this comparison, if the relative difference between the designation address of the first designating unit 4 and the designation address of the second designating unit 5 does not correspond to the count value of the control counter 6, it is possible to judge that the relative malfunction is induced between the first designating unit 4, the second designating unit 5 and the control counter 6. Accordingly, the malfunction of the FIFO memory can be accurately surely detected.

If detecting the relative malfunction all the time, a malfunction abruptly caused can be detected without delay. It is possible to take a quick measure against this malfunction. Further, if intermittently detecting the malfunction, it is feasible to reduce ingress of noises into the detected result. Further, down-sizing of the circuit can be attained.

When the malfunction of the FIFO memory is thus detected, and if resetting is effected based on the result of this detection, the control of the FIFO memory circuit thereafter can be restored to a normal status. In this case, if resetting only the counter and first and second designating units, only the FIFO memory circuit can be restored to the normal status without exerting an influence on other in-system circuits.

Second Embodiment

Figure 2:
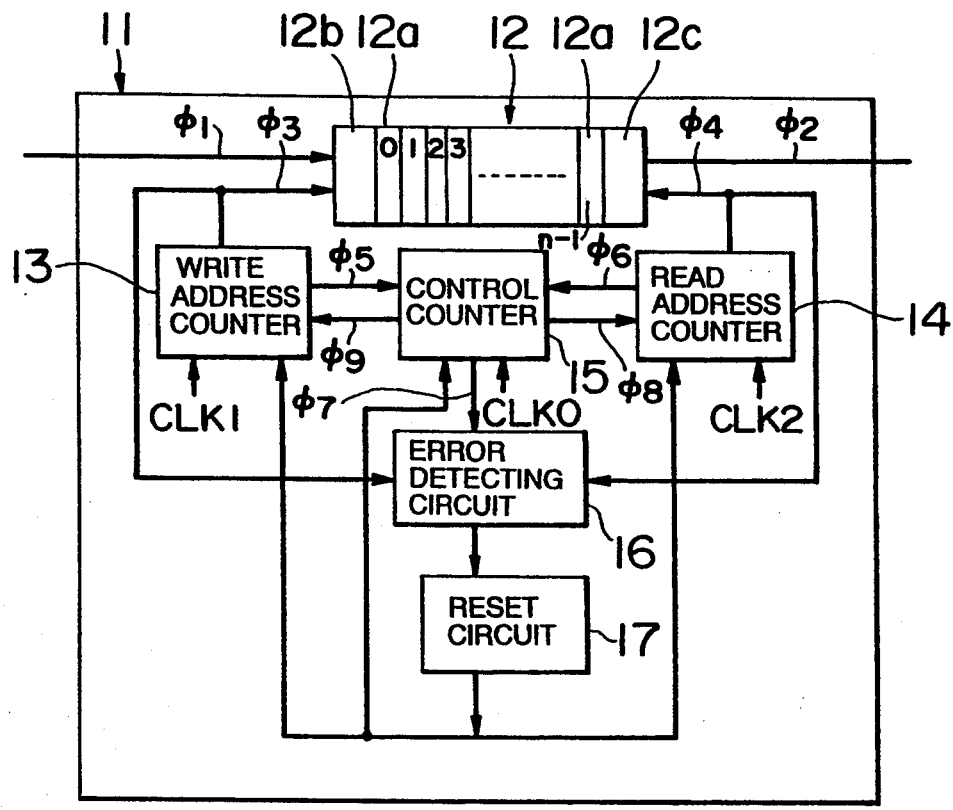
FIG. 2 is a block diagram relative to a second embodiment of this invention.

FIG. 2 is a block diagram illustrating a FIFO memory circuit 11 in a second embodiment of this invention.

The FIFO memory circuit 11 comprises a memory 12 to which the data are inputted and from which the data are outputted, a write address counter 13 connected to this memory 12, a read address counter 14 similarly connected to the memory 12 and a control counter 15 connected to the write address counter 13 and the read address counter 14 as well. The FIFO memory circuit 11 also comprises an error detecting circuit 16 connected to the write address counter 13, the read address counter 14 and the control counter 15. The FIFO memory circuit 11 further comprises a reset circuit 17 having its input terminal connected to this error detecting circuit 16 and its output terminal connected to the write address counter 13, the read address counter 14 and the control counter 15. This FIFO memory circuit 11 cooperates with other unillustrated circuits to constitute a communications system.

The memory 12 has a plurality of micro segmented memory areas 12a, a writing section 12b as a writing means and a reading section 12c as a reading means. Then, the writing section 12b receives the data sequentially transmitted via the data input line $\phi 1$ and allocate each item of data to one of the micro memory areas 12a, and the data are thus stored therein. This data allocation is conducted by designating a predetermined address corresponding to each micro memory area 12a in accordance with an address signal from the write address counter 13, which is received by the writing section 12b. Herein, for the explanation, it is assumed that n-pieces of micro memory areas 12a are provided, and the addresses given to the respective micro memory areas 12a are marked with "0" through "n−1".

The data stored in the memory 12 can be read via a data output line $\phi 2$. In this case, according to an address signal from the read address counter 14 that is received by the reading section 12c, a desired item of data can be read by designating an address of the micro memory area 12a in which the data to be read is stored.

The write address counter 13 as a first address designating means is a counter for designating an address (write address) of the memory 12 when writing the data. Then, each time a clock CLK1 generated outside the FIFO memory circuit 11 is inputted, the write address counter 13 increments its output, i.e., a counter value which indicates the write address (hereinafter termed a "write address counter value") one by one. The write address counter 13 thus outputs the counter value to a write address line $\phi 3$. Note that when the write address counter value reaches "n−1", a next write address counter value becomes "0". As discussed above, every time the write address counter value is incremented and outputted, a new item of data is written to the designated micro memory area 12a. Note that a reset signal from the reset circuit 17 is inputted to the write address counter 13, and, with inputting of this reset signal, the write address counter value is reset to the initial Value "0".

The read address counter 14 as a second address designating means is a counter for designating an address (read address) of the memory 12 when reading the data. Then, each time a clock CLK2 generated outside the FIFO memory circuit 11 is inputted, the read address counter 14 increments its output, i.e., a counter value which indicates the read address (hereinafter termed a "read address counter value") one by one. The read address counter 14 thus outputs the counter value to a read address line $\phi 4$. As described above, every time the read address counter value is incremented and outputted, the data held in the designated micro memory area 12a is read. Note that the reset signal from the reset circuit is inputted to the read address counter 14, and, with inputting of this reset signal, the read address counter value is reset to the initial value "0".

As described above, the fist-in first-out can be attained by equalizing the outputting Sequences of the counter values of the two address counters 13 and 14.

Note that the input clock CLK1 of the write address counter 13 and the input clock CLK2 of the read address counter 14 are formed with periods independent of each other for the reason that a velocity and a phase are often different between the data demanded when written and that demanded when read. As a matter of course, however, these clocks may be formed with the same period.

The control counter 15 is inputted a count-up signal outputted from the write address counter 13 via a count-up line $\phi 5$. The control counter 15 is inputted a count-down signal outputted from the read address counter 14 via a count-down line $\phi 6$. These count-up and count-down signals are pulse signals outputted each time the address counters 13 and 14 increment the address counter values. Each time this count-up signal is inputted, the control counter 15 increments its output value (hereinafter termed a "control counter value") one by one. Each time the count-down signal is inputted, the control counter 15 decrements the control counter value one by one. Accordingly, the control counter value outputted via a counter output line $\phi 7$ in a normal status indicates the number of micro memory areas 12a holding the unread data in the memory 12. Note that the control counter 15 distinguishes whether or not the control counter value is changed each time a clock CLK0 formed outwardly of the FIFO memory circuit 11 is inputted. The formations of the count-up and count-down signals and the construction of the control counter 15 are, however, determined to change the control counter value once for the single count-up or count-down signal.

When the control counter value becomes the minimum value, i.e., "0", the memory 12 does not contain the unread data any more. Hence, even when designating a new address, the micro memory area 12a corresponding thereto holds only the already-read old data. Therefore, if the reading process continues as it is, it follows that the data sequence becomes random. For this reason, in this case, the control counter 15 shuts off a read enabling signal outputted via an enabling line $\phi 8$ with respect to the read address counter 14 which needs the read enabling signal as a condition for the designating.

Further, when the control counter value reaches the maximum value, viz., "n−1" in this example, all the micro memory areas 12a in the memory 12 hold the unread data. Accordingly, when designating a new address and effecting the writing process, the unread data held in the micro memory area 12a corresponding thereto is erased by overwriting. Consequently, it happens that the data is lost, and the data sequence becomes random. Hence, in this case, the control counter 15 shuts off a write enabling signal outputted via an enabling line $\phi 9$ with respect to the write address counter 13 which needs the write enabling signal as a condition for the designating. The control counter 15 thus inhibits the writing process (in fact, the counter I5 shuts off the unillustrated write clock).

Note that the reset signal from the reset circuit 17 is inputted to the control counter 15, and, with inputting of this reset signal, the control counter value is reset to the initial value "0".

The error detecting circuit 16 is inputted the write address counter value, the read address counter value and the control counter value respectively from the write address counter 13, the read address counter 14 and the control counter 15. The error detecting circuit 16 detects whether or not there is an error between these values. More specifically, if the FIFO memory circuit 11 normally operates, a difference between the write address counter value and the read address counter value, as a matter of course, indicates the number of the micro memory areas 12a holding the unread data. On the other hand, the control counter value also indicates the number of the micro memory areas 12a holding the unread data, depending on a count condition of the above control counter 15. Hence, when in the normal state, it must follow that Write Address Counter Value−Read Address Counter Value=Control Counter Value.

It is therefore possible to detect mutual malfunctions between the respective counters 13, 14 and 15 by detecting that this relationship is collapsed.

Figure 3:
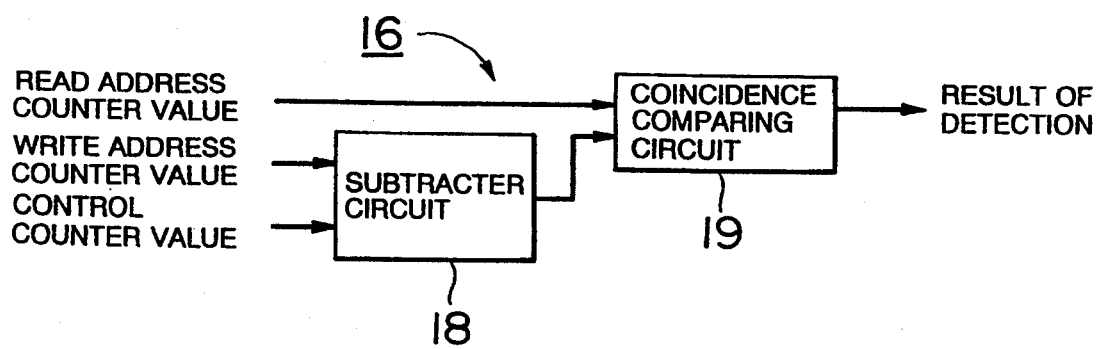
FIG. 3 is a block diagram showing details of an error detecting circuit of FIG. 2.

FIG. 3 illustrates a specific example of the error detecting circuit 16. Referring to FIG. 3, a subtracter circuit 18 is inputted each of the write address counter value and the control counter value and calculates an absolute value of a difference between these values. A coincidence comparing circuit 19 is inputted each of an output of this subtracter circuit 18 and the read address counter value. The coincidence comparing circuit 19 then distinguishes whether or not the output thereof and the address counter value are coincident with each other. Note that this error detecting circuit 16 is always driven so far as the FIFO memory 11 is employed.

Referring back to FIG. 2, the reset circuit 17 is inputted an output of the error detecting circuit 16. The reset circuit 17, when this output assumes a status indicating an "error", detects this status and transmits the reset signal to a reset input terminal of each of the counters 13, 14 and 15.

Next, the operation of the thus constructed second embodiment of the present invention will be explained by citing an operating flow chart in FIG. 4.

To start with, when the data to be inputted are transmitted to the FIFO memory circuit 11 via the data input line $\phi 1$, the write address counter 13 starts designating the write address in synchronism with the transmission of the data. Then, the write address -counter 13 outputs the address counter values "0" through "n−1" while repeatedly changing these values in sequence. The memory 12 permits the writing section 12b to receive the data to be inputted and the write address counter value. The memory 12 writes the inputted data to the micro memory area 12a corresponding to the address designated by the write address counter value. Substantially simultaneously with this process, the read address counter 14 starts designating the read address. Subsequently, the read address counter 14 outputs the address counter values "0" through "n−1 while repeatedly changing these values in sequence.

Each time the write address counter value is changed, the write address counter 13 outputs the count-up signal to the control counter 15. On the other hand, each time the read address counter value is changed, the read address counter 14 outputs the count-down signal to the control counter 15. The control counter 15 receiving these count-up and count-down signals goes on changing the control count value in a range of "0" through "n−1".

Inputted respectively to the error detecting circuit 16 is each of the write address counter value outputted by the write address counter 13, the read address counter value outputted by the read address counter 14 and the control counter value of the control counter 15.

Figure 4:
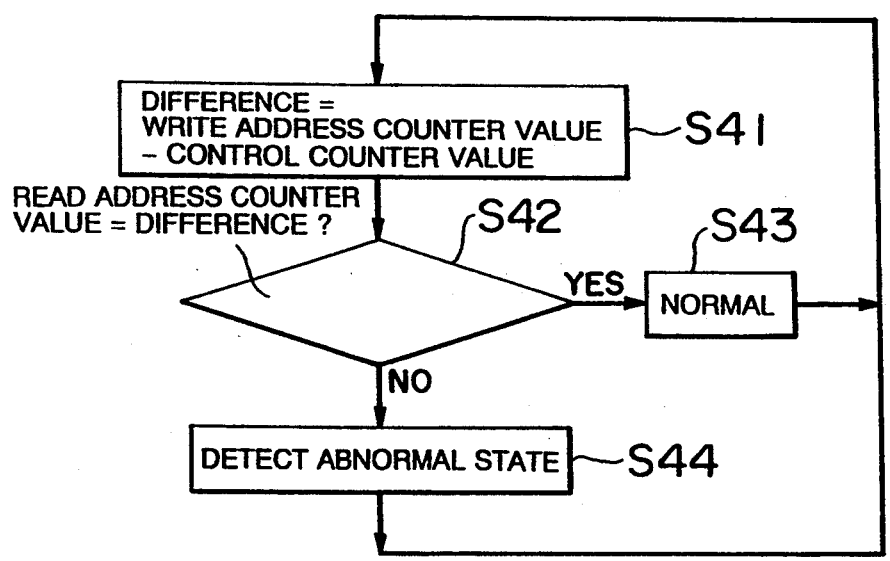
FIG. 4 is an operating flow chart of assistance in explaining the operation of the error detecting circuit of FIG. 3.

This error detecting circuit 16, at first, as shown by the operating flow in FIG. 4, permits the subtracter circuit 18 to execute a logical operation of subtracting the control counter value from the write address counter value (step 41). Then, the error detecting circuit 16 inputs a difference as a result of the verification of the step 41 to the coincidence comparing circuit 19. This coincidence comparing circuit 19 compares this difference with the read address counter value and thus distinguishes whether they are coincident or not (step 42).

As a result of this determination, if the two values are coincident, the decision is that the state is normal (step 43). In this case, the error detecting circuit 16 outputs no signal to the reset circuit 17 and repeats the above determining process.

As a result of the determination, whereas if not coincident, the decision is that an abnormal state is developed (step 44). In this case, the error detecting circuit 16 outputs an error detection signal as a result of the detection to the reset circuit 17. Thereafter, the error detecting circuit 16 repeats the above determining process.

The reset circuit 17 receiving this error detection signal outputs the reset signals to the write address counter 13, the read address counter 14 and the control counter 15.

With this resetting action, the write address counter 13 starts the address designation again from "0" and writes the data. On this occasion, the old data held by the memory 12 are erased by overwriting. On the other hand, the read address counter 14 also starts the address designation again from "0" and reads the data. The control counter 15 resets the control counter value to "0" and resumes the count-up and count-down.

Third Embodiment

Figure 5:
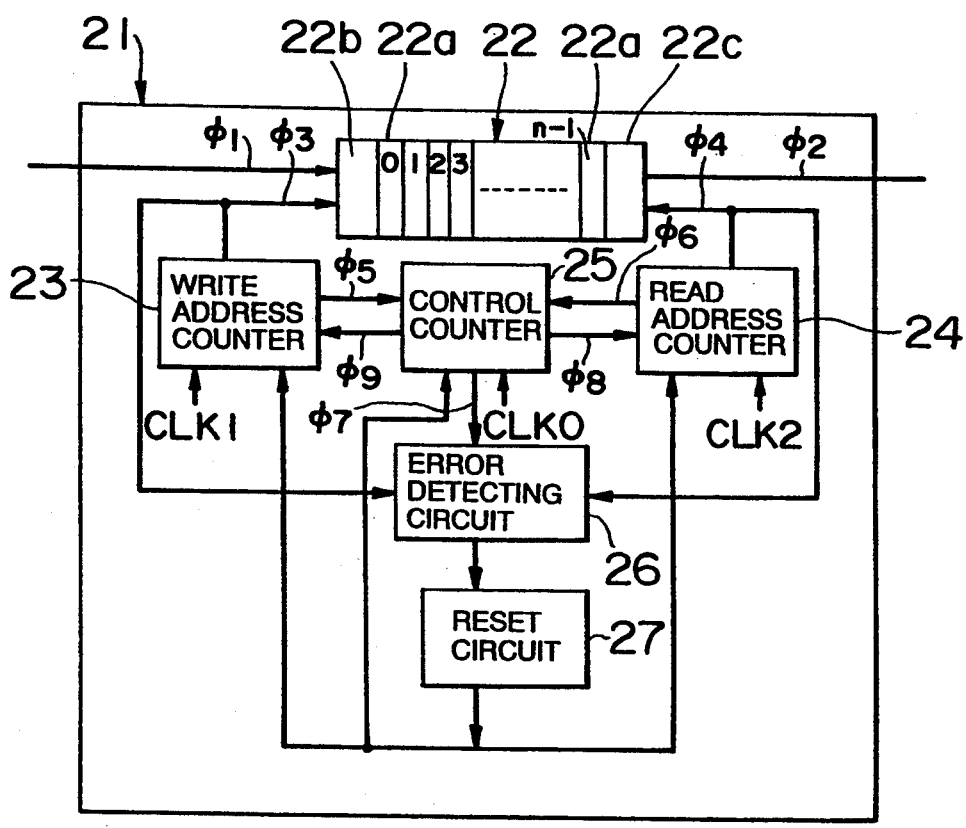
FIG. 5 is a block diagram relative to a third embodiment of this invention.

FIG. 5 is a block diagram illustrating a FIFO memory circuit 21 in a third embodiment of the present invention.

The FIFO memory circuit 21 comprises a memory 22 to which the data are inputted and from which the data are outputted, a write address counter 23 connected to this memory 22, a read address counter 24 similarly connected to the memory 22 and a control counter 25 connected to the write address counter 23 and the read address counter 24 as well. The FIFO memory circuit 21 also comprises an error detecting circuit 26 connected to the write address counter 23, the read address counter 24 and the control counter 25. The FIFO memory circuit 21 further comprises a reset circuit 27 having its input terminal connected to this error detecting circuit 26 and its output terminal connected to the write address counter 23, the read address counter 24 and the control counter 25. This FIFO memory circuit 21 cooperates with other unillustrated circuits to constitute a communications system.

Respective constructive block functions in this third embodiment are the same as the functions of the blocks to which the same names are given in the second embodiment. In the third embodiment, however, a specific construction of the error detecting circuit 26 is different from that in the second embodiment. Therefore, the specific construction of the error detecting circuit 26 will hereinafter be explained.

Figure 6:
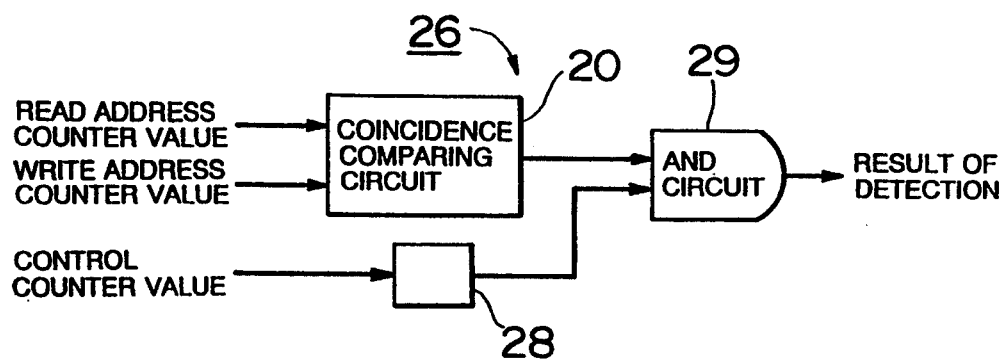
FIG. 6 is a block diagram illustrating details of the error detecting circuit of FIG. 5.

FIG. 6 is a block diagram showing a specific example of the error detecting circuit 26. In the second embodiment discussed above, the error detecting circuit 16 always outputs the result of the detection. As stated above, however, the timings (at which the clocks CLK1, CLK2 and CLK3 for driving the respective counters 23, 24 and 25 are generated) are not necessarily coincident. Hence, the timings for changing the respective counter values outputted therefrom are not also synchronized. Accordingly, it may happen that the past values are transiently mixed therein immediately before all the present counter values are figured out. For instance, that is a situation where the read address counter value is changed, and the count-down signal is outputted, while there is, developed a status wherein the control counter 25 is incapable of effecting the count-up because of corresponding to a pulse-to-pulse portion of CLK0. Such a status does not reflect the present state. Hence, the error detection continues as it is, this results in a spike (pulse-like noise having an extremely small width) which in turn hinders the accurate error detection. This spike can be eliminated by making the signal pass through a circuit such as a filter or the like. There is, however, a defect that the circuit increases in size.

Under such circumstances, the third embodiment aims at actualizing a circuit capable of reducing an occurrence of such a spike with a simple construction.

Turning to FIG. 6, the coincidence comparing circuit 20 is inputted the read and write address counter values and makes a comparison that only when the two values are not coincident, a logical value "1" is outputted. A comparing circuit 28 is inputted the control counter value and performs a comparison to output the logical value "1" only when the control counter value is 0. Output values of the coincidence comparing circuit 20 and of the comparing circuit 28 are inputted to an AND circuit 29 for outputting AND of these values as a result of the detection.

Next, the operation of the thus constructed third embodiment of this invention will be explained by citing an operating flow in FIG. 7. The operations in the third embodiment are almost common to those in the second embodiment. The description is therefore centered on only the operation of the error detecting circuit 26, and others are omitted.

Figure 7:
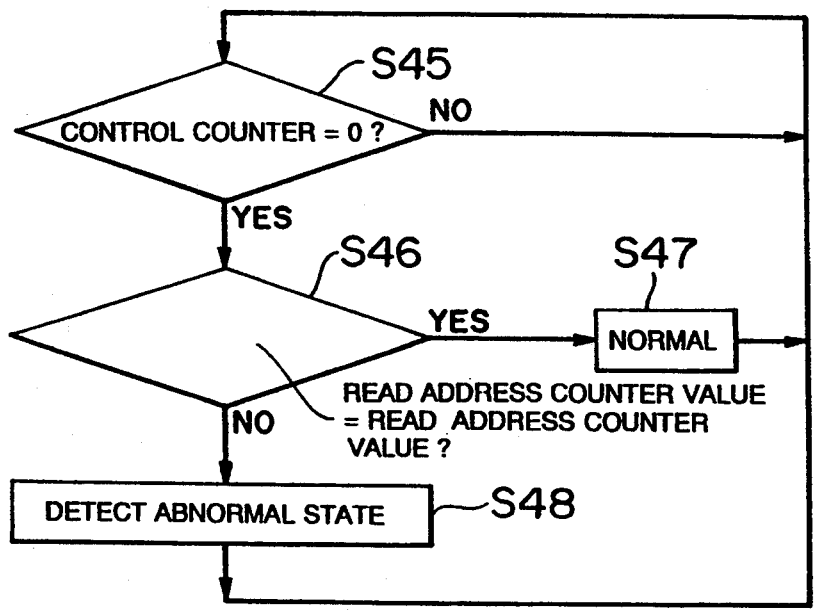
FIG. 7 is an operating flowchart of assistance in explaining the operation of the error detecting circuit of FIG. 6.

As shown by the operating flow in FIG. 7, this error detecting circuit 26, to begin with, permits the comparing circuit 28 to distinguish whether the control counter value is "0" or not (step 45). Then, if the control counter value is not "0", a logical value "0" is outputted, and a gate of the AND circuit 29 remains closed. Accordingly, in this case, no signal is outputted to the reset circuit 27. In contrast with this, if the control counter value is "0", the logical value "1" is outputted, and the gate of the AND circuit 29 is opened.

Next, the coincidence comparing circuit 20 makes a comparison as to whether or not the read address counter value coincides with the write address counter value (step 46). Then, if the two values are coincident with each other, the circuit 26 determines that the status is normal (step 47) and outputs the logical value "0". In this instance, an AND output of the AND circuit 29 remains to be the logical value "0", and, therefore, the reset circuit 27 does not recognize that the abnormal state is developed. Whereas if the two values are not coincident, the circuit 26 determines the status to be abnormal (step 48) and outputs the logical value "1". In this case, the AND output of the AND circuit 29 turns out to be the logical value "1" on condition that the output of the comparing circuit 28 is "1". Hence, the reset circuit 27 recognizes that the abnormality is produced.

The reset circuit 27 receiving the error detection signal of the logical value "1" outputs the reset signals to the write address counter 23, the read address counter 24 and the control counter 25.

According to the error detecting circuit 26 thus constructed in the third embodiment, the gate of the AND circuit 29 is opened only when the control counter value is "0". A piece of non-coincidence data (logical value "1") between the read address counter value and the write address counter value is outputted as a result of the detection. It is therefore possible to restrict the occurrence of the spike at the maximum.

Fourth Embodiment

Figure 8:
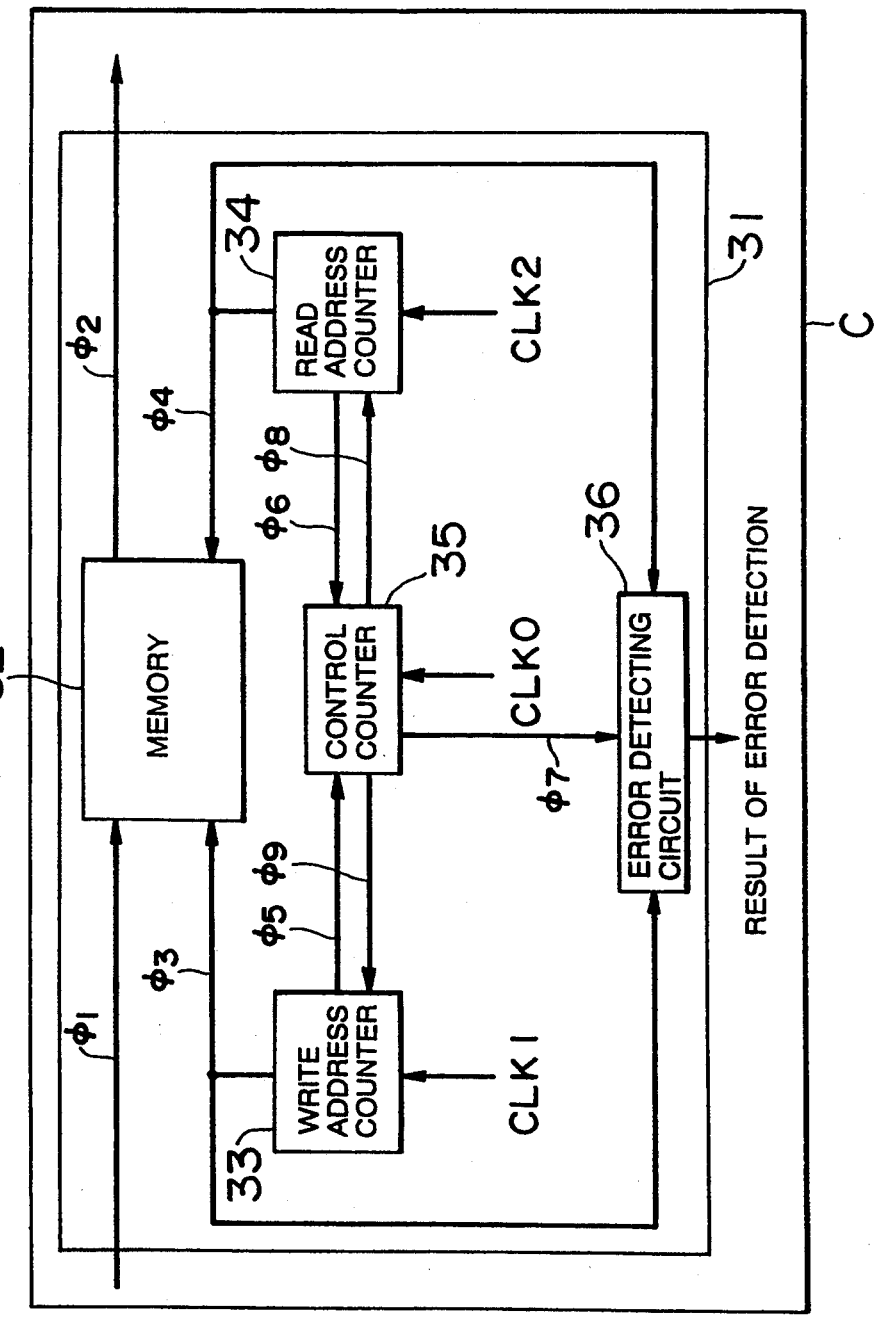
FIG. 8 is a block diagram relative to a fourth embodiment of the present invention.

FIG. 8 is a block diagram illustrating a fourth embodiment of this invention.

Only difference between the fourth embodiment and the first embodiment is that an error detection result given by an error detecting circuit 36 is outputted to the outside of a FIFO memory circuit 31.

A communications system C which employs this FIFO memory-circuit 31 includes, outwardly of the FIFO memory circuit 31, an unillustrated reset circuit, e.g., a processing circuit incorporating software for effecting resetting, or a dedicated reset circuit in which the same function with this processing circuit is attained with only hardware. Then, the construction is that, for instance, the whole communications system is reset on receiving the error detection result given by the detecting circuit 36.

Other configurations in the fourth embodiment are the same as those in the second embodiment, and hence their explanations are omitted.

Fifth Embodiment

Figure 9:
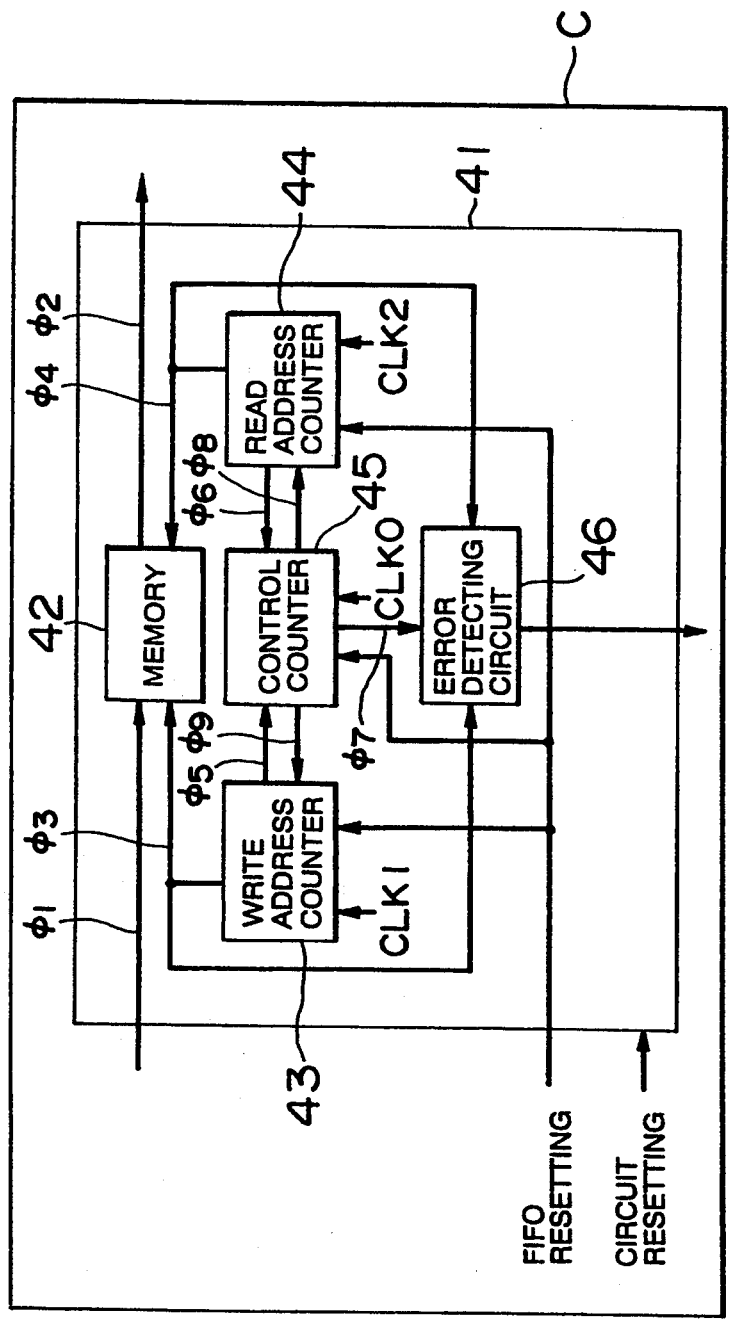
FIG. 9 is a block diagram relative to a fifth embodiment of the present invention.

FIG. 9 is a block diagram illustrating a fifth embodiment of this invention.

In accordance with this fifth embodiment, the unillustrated circuit provided outwardly of a FIFO memory circuit 41 receives an error detection result given by a detecting circuit 46. This unillustrated circuit, unlike the fourth embodiment, resets not the whole communications system C but only the counters 43, 44 and 45 which generate the FIFO (first-in first-out) function ("FIFO resetting" in FIG. 9). Note that there may be reset the entire FIFO memory circuit 41 having those counters 43, 44 and 45, the memory 42 and the error detecting circuit 46 ("circuit resetting" in FIG. 9). In this case, all the contents stored in the memory 42 are erased.

Sixth Embodiment

Figure 10:
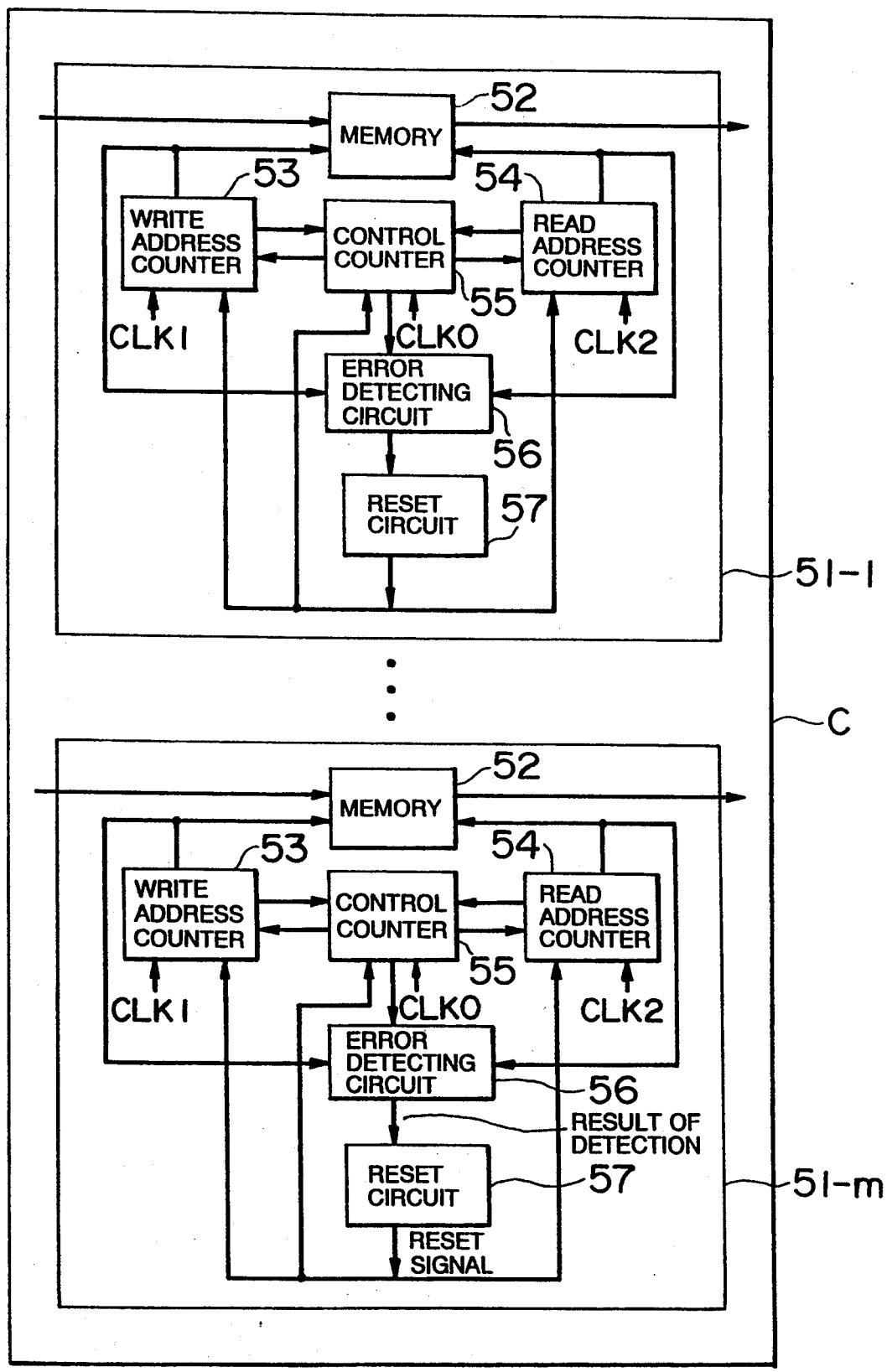
FIG. 10 is a block diagram relative to a sixth embodiment of the present invention.
Figure 11:
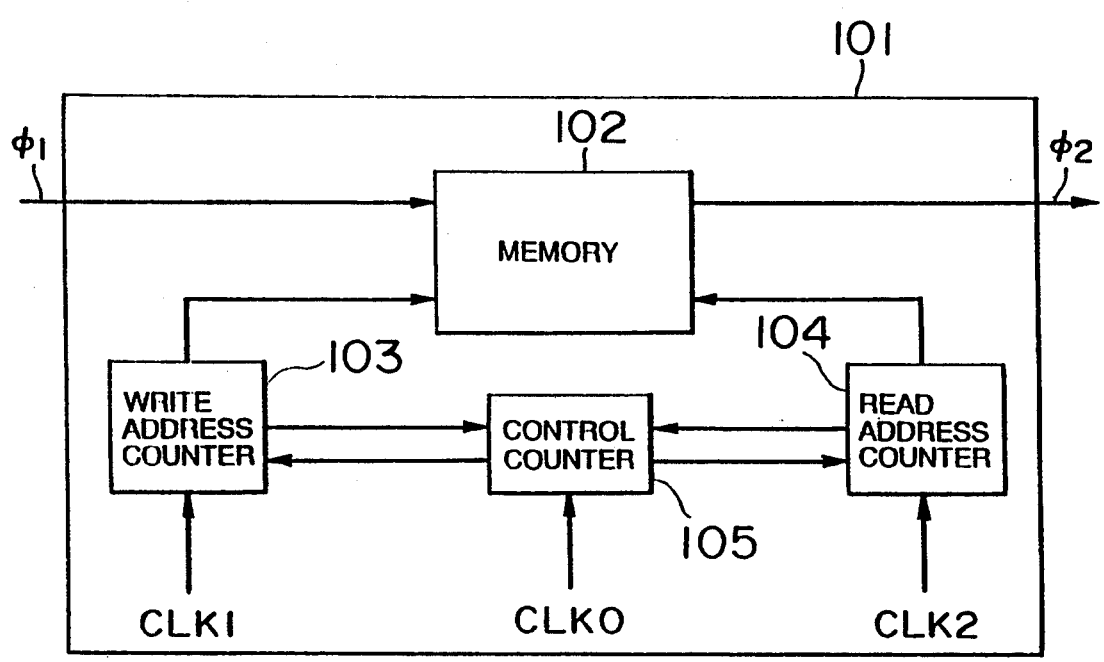
FIG. 11 is a block diagram Showing a typical construction of a FIFO memory circuit.

FIG. 10 is a block diagram showing a sixth embodiment of this invention.

This sixth embodiment presents an example where the identical communications system C incorporates a plurality of FIFO memory circuits 51-a, . . . 51-m. In this embodiment, each of the FIFO memory circuits 51-1, . . . 51-m has the same configuration with the FIFO memory circuit 11 in the second embodiment.

Accordingly, the reset action of a certain FIFO memory circuit 51 does not influence other FIFO memory circuits 51.

According to the apparatus for and the method of detecting the malfunction of the FIFO memory in the present invention, the relative malfunction between the counters is detectable from the designation addresses of the first and second designating means and the count values of the counters. It is therefore feasible to surely detect the malfunction of the FIFO memory.

It is apparent that, in this invention, a wide range of different working modes can be formed based on the invention without deviating from the spirit and scope of the invention. This invention is not restricted by its specific working modes except being limited by the appended claims.

What is claimed is:

1. An apparatus for detecting a malfunction of a first-in first-out memory, comprising:

a means for storing data;

a means for writing the data to said storing means, said writing means relating the data to a predetermined address;

a means for reading the data written by said writing means from said storing means in accordance with the predetermined address;

a first address designating means for designating the address while changing the address in accordance with a fixed sequence with respect to said writing means when the data is written to said storing means;

a second address designating means for designating the address while changing the address in accordance with the same sequence as the fixed sequence with respect to said reading means when the data is read from said storing means and thereby causing said reading means to read the data in accordance with the same sequence as writing by said writing means;

a counter for effecting count-up each time the address designated by said first address designating means is changed and effecting count-down each time the address designated by said second address designating means is changed; and a detecting means for detecting a mutual contradiction between the address designated by said first address designating means, the address designated by said second address designating means and a count value of said counter, whereby detecting an occurrence of a relative malfunction between said first address designating means, said second address designating means and said counter.

2. The apparatus according to claim 1, wherein said detecting means determines that the malfunction is produced when a relative difference between the address designated by said first address designating means and the address designated by said second address designating means does not correspond to the count value.

3. The apparatus according to claim 2, wherein said detecting means includes:

a subtracter circuit for subtracting the count value from a value of the address designated by said first address designating means; and a comparing circuit for comparing an output of said subtracter circuit with a value of the address designated by said second address designating means, said detecting means recognizing that the malfunction is produced if an output of said comparing circuit indicates a non-coincidence between the two values from the first and second addressed designating means.

4. The apparatus according to claim 1, wherein said detecting means always detects the malfunction.

5. The apparatus according to claim 1, wherein said detecting means detects the malfunction only when the count value of said counter is 0.

6. The apparatus according to claim 5, wherein said detecting means comprises:

a comparing circuit for comparing a value of the address designated by said first address designating means with a value of the address designated by said second address designating means; and a gate means for passing an output of said comparing circuit only when the count value of said counter is 0, said detecting means recognizing that the malfunction is produced if an output of said comparing circuit which has passed through said gate means indicates a non-coincidence between the two values from the first and second address designating means.

7. The apparatus according to claim 6, wherein said comparing circuit outputs a logical value 1 if the two values are not coincident, and said gate means is constructed of a first circuit for outputting the logical value 1 only when the count value is 0 and a second circuit connected to an output of said first circuit and an output of said comparing circuit and outputting AND logic of the two outputs from the first circuit and the comparing circuit.

8. The apparatus according to claim 1, further comprising a resetting means for resetting each of the designation address of said first address designating means, the designation address of said second address designating means and the count value of said counter.

9. A method of detecting a malfunction of a first-in first-out memory capable of reading a data from a storing means in the same sequence as writing the data to the storing means, the memory having the storing means, a first address designating means for designating a predetermined address while changing the address in accordance with a fixed sequence during the writing of the data, a second address designating means for designating the address while changing the address in accordance with the same sequence as the fixed sequence during the reading of the data and a counter for effecting count-up each time the address designated by said first address designating means is changed and effecting count-down each time the address designated by said second address designating mean is changed, said method comprising the steps of:
making a comparison between the designation address of said first address designating means, the designation address of said second address designating means and a count value of said counter; and
determining, as a result of the comparison, that a relative malfunction is produced between said first address designating means, said second address designating means and said counter, if a relative difference between the address designated by said first address designating means and the address designated by said second address designating means does not correspond to the count value.

10. The method according to claim 9, further comprising the step of resetting each of said first address designating means, said second address designating means and said counter when determining that the relative malfunction is produced.

* * * * *